United States Patent [19]

Okabe

[11] Patent Number: 5,200,026

[45] Date of Patent: Apr. 6, 1993

[54] MANUFACTURING METHOD FOR MULTI-LAYER CIRCUIT BOARDS

[75] Inventor: Shuichi Okabe, Shiga, Japan

[73] Assignee: International Business Machines Corporation, Armonk, N.Y.

[21] Appl. No.: 700,287

[22] Filed: May 15, 1991

[30] Foreign Application Priority Data

May 18, 1990 [JP] Japan ................................ 2-127051

[51] Int. Cl.$^5$ .......................... B44C 1/22; C23F 1/00; B29C 37/00
[52] U.S. Cl. .................................. 156/651; 156/652; 156/656; 156/659.1; 156/902
[58] Field of Search ............... 156/645, 651, 652, 656, 156/659.1, 901, 902, 664, 666, 668; 430/312, 313, 314, 316, 318, 323, 329; 29/846, 848, 876

[56] References Cited

U.S. PATENT DOCUMENTS

| | | | |
|---|---|---|---|
| 4,670,091 | 6/1987 | Thomas et al. | 156/643 |
| 4,970,106 | 11/1990 | DiStefano et al. | 156/902 X |

FOREIGN PATENT DOCUMENTS

| | | |
|---|---|---|
| 50-02059 | 1/1975 | Japan . |
| 0118390 | 10/1976 | Japan . |
| 58-93298 | 2/1983 | Japan . |
| 0180197 | 9/1985 | Japan . |
| 61-90496 | 5/1986 | Japan . |
| 0127196 | 6/1986 | Japan . |
| 0179598 | 8/1986 | Japan . |
| 0121393 | 9/1986 | Japan . |
| 0263645 | 11/1987 | Japan . |
| 0244797 | 10/1988 | Japan . |

Primary Examiner—William A. Powell
Attorney, Agent, or Firm—Richard M. Goldman

[57] ABSTRACT

Disclosed is a method of manufacturing a multilayer circuit board. The interlayer electrical connection between the lower-layer and upper-layer electric circuits is formed in the same photoresist step as the formation of the lower-layer electrical circuit. The process includes sequentially coating at least two metal layers onto the circuit board substrate, and thereafter applying positive photoresist on the upper metal layer of the metal layers. The photoresist is then imaged, i.e., exposed and developed, to define a predetermined pattern. The metal layers uncovered by the photolithopgraphy are etched, leaving a predetermined pattern. Then the upper metal layer not covered by the remaining photoresist is etched to form a via bump and the lower-layer electric circuit. In the next step the remaining photoresist on the upper metal layer is removed, an organic dielectric layer on said etched metal layers, the surface of the organic dielectric layer is flattened to expose the surface of the via bump, and another metal layer is deposited atop the dielectric. This layer constitutes the upper-layer electric circuit atop the organic dielectric layer and the exposed surfaces of the via bump.

10 Claims, 4 Drawing Sheets

MANUFACTURING METHOD FOR MULTI-LAYER CIRCUIT BOARDS

FIELD OF THE INVENTION

This invention relates to an interlayer connection forming method for multilayer printed circuit boards, more particularly to a manufacturing method for multi-layer printed circuit boards used for printed circuit boards, etc. that for computers requiring high- density packaging.

BACKGROUND OF THE INVENTION

Conventionally, the insulation-layer etching method and the plating pillar method are known as the inter-layer connection forming techniques for thin-film multilayer wiring on an organic substrate consisting of materials such as ceramic. FIG. 4 shows the process of the insulation-layer etching method. This method forms a conductor 11 on a substrate 10 having a dielectric layer. Then, photoresist 12 is blanket-applied onto the conductor 11, which is selectively exposed and developed. The conductor 11 is selectively etched to form lower-layer wiring 13 on desired locations. Then, remaining photoresist is removed. A dielectric layer 14 consisting of photosensitive resin is deposited on the formed lower-layer wiring 13 to form via 15 by a dry or wet etching method and to expose the lower-layer wiring 13. Then, upper-layer wiring 16 is deposited on the via 15 and the lower-layer wiring 13 using a film forming technique such as electroless plating, deposition, and sputtering. Multilayer wiring is formed on the organic substrate through repeated formation of the dielectric and the wiring layers.

Published Unexamined Patent Application No. 51-118390 describes that a predetermined multilayer wiring structure is formed by forming a polyimide resin film on a printed circuit board on which Al wiring conductors are formed, then forming an organic Al-compound layer on the surface of the polyimide resin film, and removing parts of the organic Al-compound layer from the polyimide resin film and forming through-holes therein, and then forming a second conductor layer of Al in the through-holes.

Published Unexamined Japanese Patent Application No. 58-93298 describes that a lower-layer wiring pattern is formed through forming a wiring conductor layer on a substrate, and then forming a resist layer thereon; and that the resist layer is removed, forming through-holes, an interlayer dielectric film constituting multilayer wiring is formed by using polyimide-based resin, a resist film being formed on the dielectric layer, forming connecting through-holes, the dielectric layer being baked after removal of the resist film, upper-layer wiring being formed on the dielectric layer.

Published Unexamined Japanese Patent Application No. 60-180197 describes that multilayer wiring patterns are formed by forming a primary layer on a dielectric substrate, forming a photopolymer film on the wiring pattern, and exposing, photo-setting and developing the photopolymer film to form a photo-set film with via holes at predetermined positions. Then, secondary layer wiring patterns are formed on the photo-set film of the photopolymer used as an interlayer dielectric film and on the via hole portions, and said photopolymer-film forming processes and processes are repeated in turn thereafter.

Published Unexamined Japanese Patent Application No. 61-121393 and Published Unexamined Japanese Patent Application No. 61-127196, what is described is that using the above dielectric layer etching method, wiring patterns of materials such as copper, chromium is formed on a dielectric layer surface through plating, sputtering, or evapolation, and, at the same time, the via hole portions is made conductive in order to electrically connect with a lower-layer conductor pattern.

FIG. 5 shows the process of the plating pillar method process. In this method, lower-layer wiring 103 is deposited on a substrate 101 blanket-coated with polyimide resin using film forming techniques such as sputtering. A bonding layer such as chromium is placed between the lower-layer wiring 103 and the substrate 101. Moreover, photosensitive resist 104 is blanket-coarted on the lower-layer 103, which is removed after pattern exposure and development to form a resist hole 105. A plating pillar 106 is formed in the resist hole 105 through, for example, electroplating, and the resist 104 is removed by, for example, solvent. Then, the plating column is coated with polyimide 107 whose surface is smoothed by polishing to expose the head of the plating pillar 106, and to form upper-layer wiring 108 on it using a film forming technique such as sputtering. Multilayer wiring is formed by repeating the above processes.

Published Unexamined Japanese Patent Application No. 61-90496 describes a process in which a plating pillar is formed in a through-hole by forming a metal foil for conductor circuits on a dielectric substrate to form lower-layer wiring through photoresist application, pattern exposure, development, plating, resist removal, and etching. Then a polyimide film is formed and a through-hole is formed with a mechanical drill or laser beam at the portion to be made conductive, and next the plating pillar is formed through locally supplying plating solution and a laser beam.

Published Unexamined Japanese Patent Application No. 63-43396 describes a process in which multilayer wiring is formed by forming a lower layer on the entire surface of a multilayer wiring alumina substrate and press-fitting a positive-type dry film before obtaining resist patterns through exposure and development, forming a plating pillar in formed via holes through electroplating, and removing the plated resist pattern with solvent, before applying a dielectric layer, polishing the surface of the dielectric layer to expose the head of the plating column and coat it with a dielectric layer, forming via holes with a required diameter on the dielectric layer, sputtering copper inside the via holes and on the surface of the dielectric layer, and forming necessary circuit patterns through etching.

Published Unexamined Japanese Patent Application No. 63-244797 describes a process in which necessary wiring is formed by laminating a positive-type dry film on an alumina substrate with lower-layer wiring patterns formed on it to make resist patterns and forming resist holes for plating pillars through exposure and development and then plating the resist holes with copper sulfate to form a plating pillar, before removing said resist with acetone to coat the pillar with a polyimide dielectric layer, polishing the surface of the dielectric layer to expose the head of the plating pillar, and installing a copper layer on the surface of the dielectric layer and the head of the plating pillar.

Published Unexamined Japanese Patent Application No. 61-179598 describes a process in which wiring is formed by forming photoresist patterns on the surface of copper wiring patterns formed on a ceramic substrate as lower-layer wiring through ordinary photolithography technique, depositing a plating pillar through electroplating on the surface of the lower wiring layer exposed through the photoresist hole, applying polyimide resin to the entire exposed surface of the plating pillar and substrate, applying predetermined pressure to the lower-layer surface in the direction of the substrate to flat the surface, and evapolating an upper wiring layer at predetermined positions on the surface of the dielectric layer.

Published Unexamined Japanese Patent Application No. 62-263645 describes a process in which predetermined patterns are formed on a substrate by etching chromium and copper layers blanket-applied in turn on the substrate, blanket-applying the copper layer with positive photoresist, exposing and developing the resist to form an opening (via hole), sililating the positive photoresist, forming a plating pillar in the opening by dipping the opening in a molten-solder bath though the sililated resist remains as solder barrier, and connecting upper-layer wiring to the pillar.

Published Unexamined Japanese Patent Application No. 50-2059 describes that a dielectric substrate made of, for example, ceramic is covered with a copper layer as lower-layer wiring, photoresist is deposited on the copper layer, the photoresist is exposed and developed to form a resist hole, a conductive material (plating pillar) such as copper is deposited in the hole through electroplating, the esidual photoresist is removed when electroplating is completed, before a dielectric material such as epoxy resin is deposited, a copper layer is electroless-plated on the conductive and dielectric materials, and interlayer connection is performed.

According to the above-mentioned dielectric layer etching methods, however, the via diameter is limited to the minimum value allowing plating because the via formed by etching are required to be made conductive through plating. In addition, to electrically connect lower-layer wiring with upper-layer wiring, it is necessary to provide a land on the electric circuit at the bottom of the via. However, to accurately align the land with the via, the electric-circuit forming density cannot be increased because the via diameter must be increased (for example, about 0.1 mm).

Furthermore, when a via is formed in a dielectric layer through wet etching, the taper angle of the hole wall increases and refining becomes difficult because the dielectric layer is etched while old etching solution is being replaced with new solution. Moreover, disconnection may occur between the lower-layer wiring and the upper-layer wiring unless resist is completely removed from on the lower-layer wiring. Therefore, perfect etching is not always expected. When the inside of the via is coated, the device reliability is degraded unless a uniform plating layer is formed on the side wall and the bottom.

On the other hand, when a via is formed in a dielectric layer through dry etching, an organic substrate is not desirable because gas is produced, and a ceramic, silicone, or glass substrate is impracticable because etching takes a longer time unless the metal layer thickness is made thin.

The above-mentioned plating pillar method has the disadvantage that extra processes are needed because photoresist is applied to or removed from a dielectric layer only to form a via bump (plating pillar).

OBJECTS OF THE INVENTION

An object of the invention is to attain interlayer connection of multilayer boards while increasing the electric-circuit forming density by highly decreasing the via diameter.

Another object of the invention is to decrease the number of manufacturing processes by using the same positive photoresist used to form the lower-layer electric circuit to form the via bump, omitting the extra photoresist applying process which is used only to form the via bump.

Still another object of the invention is to eliminate the land from the electric circuit on the bottom of the via.

SUMMARY OF THE INVENTION

These and other objects are attained and the shortcoming of the art are obviated by the method of the invention. According to the invention there is provided a method of manufacturing a multilayer circuit board with an interlayer connection between circuit layers that does not require drilling or lands.

The interlayer electrical connection between the lower-layer and upper-layer electric circuits is formed in the same photoresist step as the formation of the lower-layer electrical circuit. The process includes sequentially coating at least two metal layers onto the circuit board substrate, and therteafter applying positive photoresist on the upper metal layer of the metal layers. The photoresist is then imaged, i.e., exposed and developed, to define a predetermined pattern.

The metal layers uncovered by the photolithopgraphy are etched, leaving a predetermined pattern. Then the upper metal layer not covered by the remaining photoresist is etched to form a via bump and the lower-layer electric circuit. In the next step the remaining photoresist on the upper metal layer is removed, an organic dielectric layer on said etched metal layers, the surface of the organic dielectric layer is flattened to expose the surface of the via bump, and another metal layer is deposited atop the dielectric. This layer constitutes the upper-layer electric circuit atop the organic dielectric layer and the exposed surfaces of the via bump.

DETAILED DESCRIPTION OF THE INVENTION

Figure 1A:
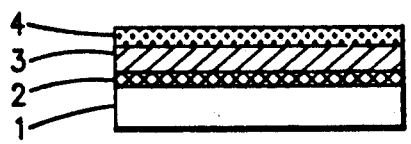
FIG. 1 (a) through (j) are process drawings showing the embodiment of this invention.
Figure 1F:
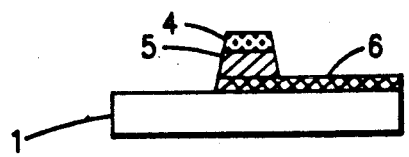
Figure 1B:
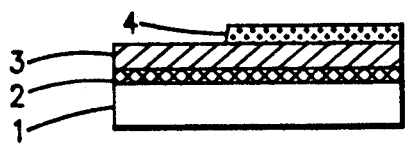
Figure 1G:
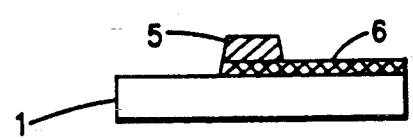
Figure 1C:
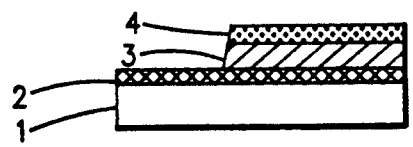
Figure 1H:
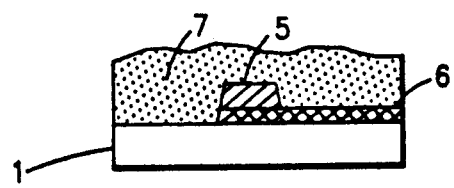
Figure 1D:
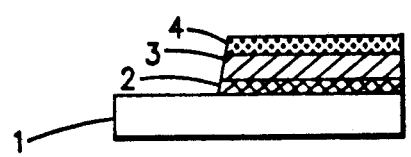
Figure 1I:
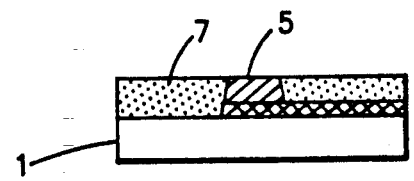
Figure 1E:
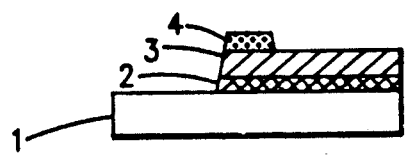
Figure 1J:
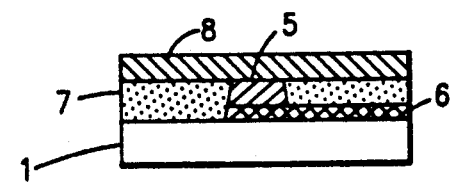
Figure 2A:
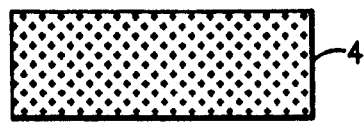
FIG. 2 (a) through (j) are plan views corresponding to FIG. 1 (a) through (j) respectively.
Figure 2F:
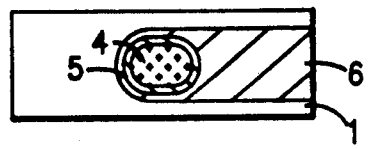
Figure 2B:
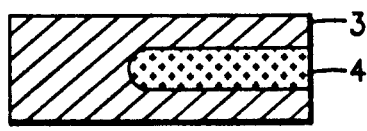
Figure 2G:
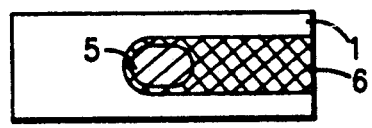
Figure 2C:
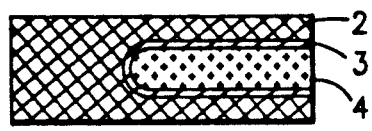
Figure 2H:
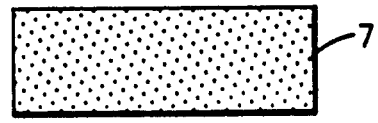
Figure 2D:
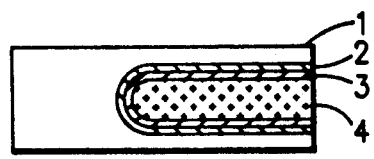
Figure 2I:
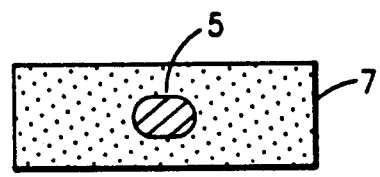
Figure 2E:
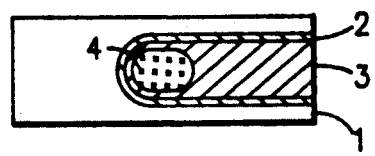
Figure 2J:
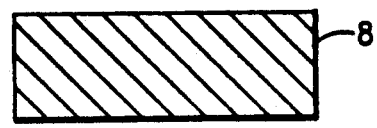

In this invention a conductive via is subtractively formed from the same metallization as the lower level electric circuit in a multilayer electronic package. According to one exemplification of the invention at least two different types of metal layers are formed on a substrate through lamination or plating. Photoresist is applied atop these metal layers. This photoresist is imaged, i.e., exposed, developed, and removed, to form patterns corresponding to the lower-layer electric circuit. The lower-layer electric circuit is formed on the substrate through etching along the patterned photoresist. Where different materials are used for the metallization, the etching is repeated for a number of times equal to the number of metal layers. Then, the residual photoresist is removed, except for the photoresist remaining on the metal layers to be left as a via bump. This remaining photoresist is imaged, i.e., exposed, developed, and removed. The metal layers to be left as the electric circuit are etched along the formed resist patterns, so that the metal layers to become the via bump will remain. As a result, the metal layers to become the via bump are not etched and remain, and the bump is formed on the electric circuit.

This invention makes it possible to easily form the via bump. Because this invention, unlike the prior art method of etching the dielectric layer and subsequently plating the etched dielectric, uses a totally subtractive conductive via forming method in which the metal to become a conductive via (via bump) is etched, the via diameter can be reduced until the metal to become the bump almost disappears through etching. Moreover, because of using the arrangement of laminating the metal layer to become the via bump onto the metal layer to become an electric circuit, it is not necessary to provide a land on the electric circuit at the bottom of the via as in the dielectric layer etching method. It is also possible to use the positive resist remained in forming the lower-layer electric circuit for forming the via bump.

A preferred embodiment of the invention is illustrated in FIGS. 1 (a) through (j) and 2(a) through (j). FIG. 2 (a) through (j) show the plan view corresponding to FIG. 1 (a) through (j), respectively.

As shown in FIG. 1 (a), a 10 μm-chromium metal layer 2 and a 30 μm-copper metal layer 3 are applied to an organic substrate 1 using known film forming techniques such as evaporation, sputtering, and electroless-plating, among others. Then, positive resist 4 is applied on the chromium layer 1 and the copper layer 2. Any of the easily-available photoresists such as AZ1350J (SHIPLEY), TNS (IBM), and PMER-P (TO-KYOOHKA) can be used. Application is usually made with a brush, a spin coating method, or dipping.

Then, the positive photoresist 4 is exposed through a mask (not shown) (the wiring pattern portion is opaque and portions other than the wiring pattern portion are transparent) and developed. As shown in FIG. 1 (b) and FIG. 2 (b), resist areas other than the resist area corresponding to the intended wiring leads are removed and the copper layer 3 is partially exposed.

As shown in FIG. 1 (c) and FIG. 2 (c), the copper layer 3 is etched with any suitable etching solution. This may be wet etching in which an object is dipped, for example, in 50° C. cupric chloride for about 150 sec. Then, the chromium layer 2 which is exposed by etching of the copper layer 3 is etched with any suitable chromium etching agent. This is wet etching in which an object is dipped, for example, in a 20° C. mixed solution of three parts of concentrated hydrochloric acid and seven parts of water for 5 min. As a result, the surface of the substrate 1 is locally exposed as shown in FIG. 1 (d) and FIG. 2 (d).

For a substrate consisting of ceramic, silicone, or glass, dry etching may be applied, using a conventional gas such as Ar or $CF_4$ suitable for the material to be etched, instead of the wet etching.

The positive photoresist remaining after the above process is exposed through a mask (not shown) (the via bump portion is opaque and portions other than the via bump portion are transparent), and developed by a solution containing an oxidizing agent such as alkaline solution, nitric acid, sulfuric acid, and aqueous hydrogen peroxide. Thus, as shown in FIG. 1 (e) and FIG. 2 (e), areas other than the resist corresponding to the area where the via bump is formed are removed and the surface of the copper layer 3 is partially exposed. Then, as shown in FIG. 1 (f) and FIG. 2 (f), the copper layer 3 is etched by using a suitable etching agent. This is wet etching in which an object is dipped, for example, in etching solution consisting of cupric chloride. When the copper layer 3 is thus etched, the surface of the chromium layer 2 is partially exposed and, at the same time, the via bump 5 is formed under the residual resist 4 in FIGS. 1(f) and 2(f).

Then, when the residual resist is removed, formation of the via bump 5 and the lower-layer electric circuit 6 is completed as shown in FIG. 1 (g) and FIG. 2 (g). The bump diameter (via diameter) can be reduced to as low as about 0.015 mm by this invention, while the conventional via diameter of the prior art can be reduced only to as low as about 0.1 mm. FIG. 1 (h) and FIG. 2 (h) show an organic dielectric resin, such as epoxy resin, polyimide resin or acrylic resin, that is applied, dried and set on the organic substrate 1, the via bump 5, and the lower-layer electric circuit 6 to cover their surfaces. Then, the surface of the organic dielectric resin 7 is polished by a belt sander (a rotary polishing machine with sandpaper in a form of belt) or a brush polishing machine (a polishing machine with a brush having abrasives) to expose the head of the via bump 5 as shown in FIG. 1 (i) and FIG. 2 (i). Then, the upper-layer electric circuit metal layer 8 consisting of copper, etc. is formed on the surface of the organic dielectric resin 7 and the via bump 5 through a film forming method such as electroplating. For a thin metal layer formed on a substrate such as of ceramic, silicone, or glass, a film can be formed by a film forming technique such as sputtering or evaporation. The lower-layer electric circuit 6 is electrically connected with the upper-layer electric circuit through the via bump 5. A multilayer wiring can be formed by repeating the above process.

Figure 3:
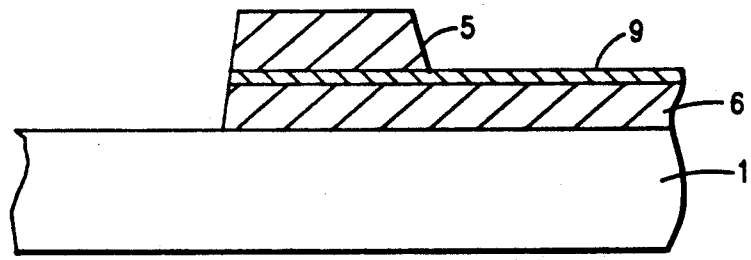
FIG. 3 is an another preferable embodiment showing the formed via bump.
Figure 4:
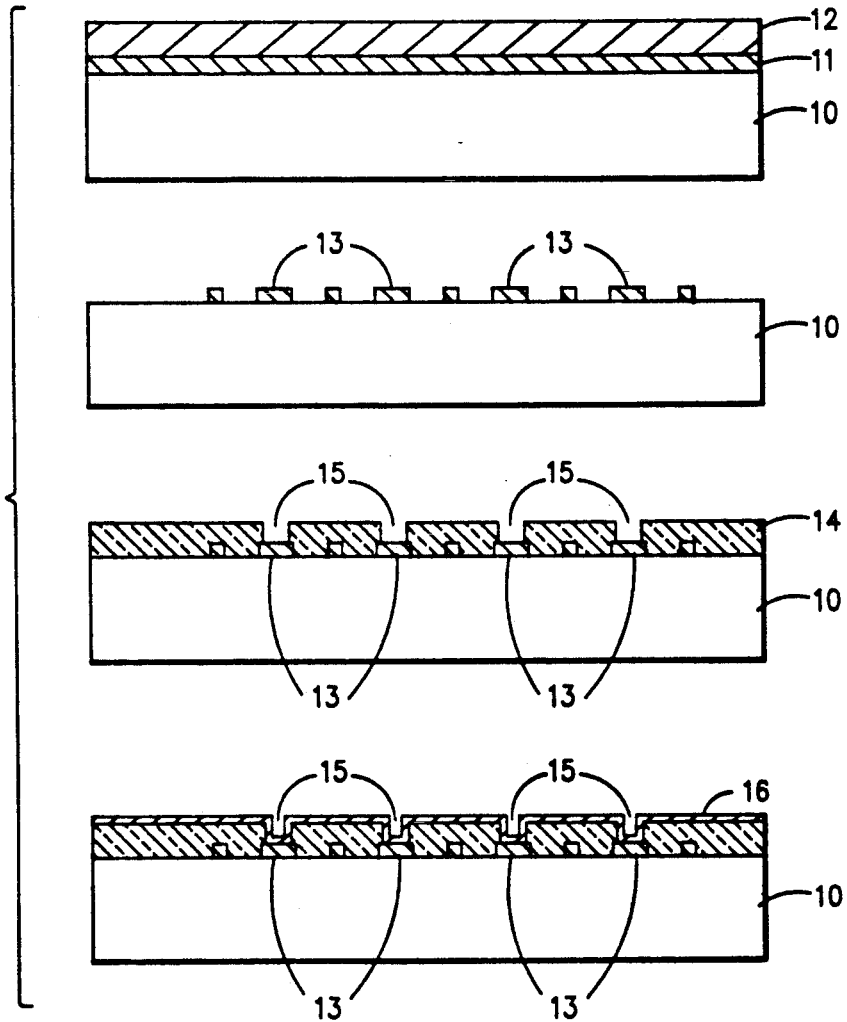
FIG. 4 is a process drawing for the conventional insulation-layer etching method.
Figure 5:
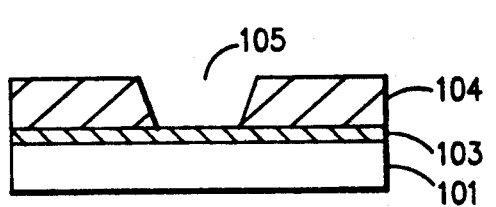
FIG. 5 is a process drawing for the conventional plating-column method.
Figure 5:
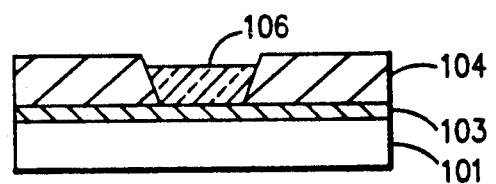
Figure 5:
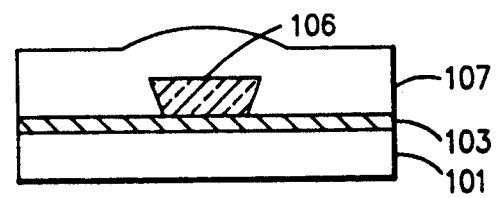
Figure 5:
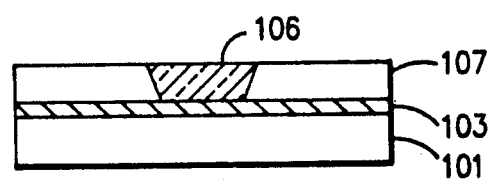
Figure 5:
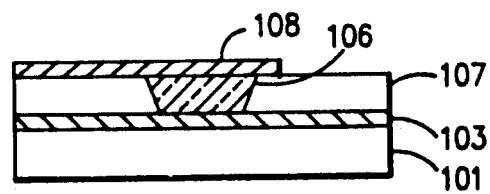

FIG. 3 shows an alternative embodiment. In this alternative embodiment the lower-layer electric circuit 6 is connected with the upper-layer electric circuit 8 (not shown) through the via bump 5 by depositing the upper-layer electric circuit 8 on the formed via bump 5.

In this embodiment, the organic substrate 1 is coated with a metal layer made of copper to become the lower-layer electric circuit 2, on which a tin layer 9 is applied to form a double-layer structure. The structure is further coated with a copper layer to become the via bump 5. The tin layer 9 serves as a mask so that the lower-layer electric circuit metal layer 6 will not be etched when the via bump 5 is formed. In the latter and the former embodiments, the type of the metal layer to be formed on the substrate and the number of the metal layers are different. However, the series of processes to form the via bump 5 is the same. Cupric chloride is used as the etching solution for the metal layer 2 made of a copper layer and the metal layer 5 to become the via bump, and a mixed solution of ammonium fluoride and aqueous hydrogen peroxide is used as the etching solution for the tin layer 9.

This invention makes it possible to increase the wiring density in interlayer connections of multilayer boards by drastically reducing the via diameter. The invention also makes it possible to omit the extra resist application process required to form the via bump, by using the same positive photoresist used to form the lower-layer electric circuit for forming the via bump. Thus, the number of manufacturing processes can be reduced.

While the invention has been described with respect to cerrtain prerferred embodiments and exemplifications, it is not intended to limit the scope of the invention thereby, but solely by the claims appended hereto.

I claim:

1. A method of manufacturing a multilayer circuit board with interlayer electrical connection between lower-layer and upper-layer electric circuits, both of which are formed on a substrate, said method comprising steps of:
   (a) sequentially coating at least two metal layers on said substrate,
   (b) applying positive photoresist on the upper metal layer of said metal layers,
   (c) exposing and developing said photoresist to define a predetermined pattern,
   (d) etching said upper metal layer,
   (e) further, etching the metal layer(s) under said upper metal layer,
   (f) exposing and developing the residual photoresist after the above exposure and development to define a predetermined pattern,
   (g) etching the upper metal layer not covered by the remaining photoresist to form a via bump and the lower-layer electric circuit,
   (h) removing the remaining photoresist on the upper metal layer,
   (i) depositing an organic dielectric layer on said etched metal layers,
   (j) flattening the surface of the organic dielectric layer to expose the surface of said via bump, and
   (k) depositing another metal layer constituting the upper-layer electric circuit on said organic dielectric layer and the exposed surfaces of said via bump.

2. The manufacturing method for a multilayer circuit board of claim (1), wherein said upper metal layer is a copper layer.

3. The manufacturing method for a multilayer circuit board of claim (2), comprising wet etching the upper metal layer using cupric chloride.

4. The manufacturing method for a multilayer circuit board of claim (1), wherein the metal layer under said upper metal layer is a chromium layer.

5. The manufacturing method for a multilayer circuit board of claim (4), comprising wet etching the metal layer under the upper metal layer using a mixed solution of concentrated hydrochloric acid and water.

6. The manufacturing method for a multilayer circuit board of claim (1), wherein the metal layer under said upper metal layer has a double-layer structure.

7. The manufacturing method for a multilayer circuit board of claim (6), wherein the upper metal layer of said double-layer structure is a tin layer.

8. The manufacturing method for a multilayer circuit board of claim (7), comprising wet etching said upper metal layer using a mixed solution of ammonium fluoride and aqueous hydrogen peroxide.

9. The manufacturing method for a multilayer printed circuit board of claim (6), wherein the lower metal layer of said double-layer structure is a copper layer.

10. The manufacturing method for a multilayer printed circuit board of claim (9), comprising wet etching said lower metal layer using cupric chloride.

* * * * *